(12) United States Patent
Yang et al.

(10) Patent No.: US 6,358,392 B1
(45) Date of Patent: Mar. 19, 2002

(54) BISMUTH THIN FILMS STRUCTURE AND METHOD OF CONSTRUCTION

(75) Inventors: Fengyuan Yang, Baltimore, MD (US); Kai Liu, San Diego, CA (US); Chia-Ling Chien, Lutherville; Peter C. Searson, Stevenson, both of MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 09/442,776

(22) Filed: Nov. 18, 1999

Related U.S. Application Data
(60) Provisional application No. 60/125,618, filed on Mar. 22, 1999, and provisional application No. 60/108,985, filed on Nov. 18, 1998.

(51) Int. Cl.[7] .......................... C25D 5/34; C25D 5/00; C25D 5/50; C25D 3/00; C23C 28/00
(52) U.S. Cl. .................. 205/205; 205/80; 205/183; 205/224; 205/227; 205/261; 205/922
(58) Field of Search ............... 205/80, 183, 227, 205/922, 261, 205, 224

(56) References Cited

U.S. PATENT DOCUMENTS

| | | | |
|---|---|---|---|
| 3,652,442 A | * 3/1972 | Powers et al. | 204/273 |
| 3,857,734 A | 12/1974 | Chen et al. | 117/240 |
| 5,256,260 A | 10/1993 | Norton et al. | 204/71 |
| 5,395,371 A | 3/1995 | Miller et al. | 606/61 |
| 5,474,551 A | 12/1995 | Finn et al. | 606/61 |
| 5,499,983 A | 3/1996 | Hughes | 606/61 |
| 5,879,351 A | 3/1999 | Viart | 606/61 |
| 5,883,762 A | * 3/1999 | Calhoun et al. | 360/113 |
| 5,961,518 A | 10/1999 | Errico et al. | 606/61 |
| 6,015,082 A | * 1/2000 | Kivilahti | 228/180.22 |

FOREIGN PATENT DOCUMENTS

JP 53057808 A * 5/1978

OTHER PUBLICATIONS

Loshkarev et al., "Electrodeposition of Manganese and a Manganese Alloy", Elektrokhim. Margantsa, vol. 3, pp. 292–302 (no month available) 1967 abstract only.*

* cited by examiner

*Primary Examiner*—Edna Wong
(74) *Attorney, Agent, or Firm*—Dickstein Shapiro Morin & Oshinsky LLP

(57) ABSTRACT

The invention is directed to the use of electrochemical deposition to fabricate thin films of a material (e.g., bismuth) exhibiting a superior magnetoresistive effect. The process in accordance with a preferred embodiment produces a thin film of bismuth with reduced polycrystallinization and allows for the production of single crystalline thin films. Fabrication of a bismuth thin film in accordance with a preferred embodiment of the invention includes deposition of a bismuth layer onto a substrate using electrochemical deposition under relatively constant current density. Preferably, the resulting product is subsequently exposed to an annealing stage for the formation of a single crystal bismuth thin film. The inclusion of these two stages in the process produces a thin film exhibiting superior MR with a simple field dependence in the process suitable for a variety of field sensing applications.

16 Claims, 3 Drawing Sheets

BISMUTH THIN FILMS STRUCTURE AND METHOD OF CONSTRUCTION

This application claims benefit from U.S. Provisional Application No. 60/108,985 filed on Nov. 18, 1998, and from U.S. Provisional Application No. 60/125,618 filed on Mar. 22, 1999.

GOVERNMENT INTEREST

This invention was made with U.S. Federal government support under Grant Nos. NSF96-32526 and NSF97-32763 awarded by the National Science Foundation. The government has certain rights in the invention.

BACKGROUND OF THE INVENTION

Magnetoresistive (MR) materials experience changes in electrical resistivity when exposed to external magnetic fields. Such materials have a wide range of use because of their ability to detect and differentiate magnetic field strength. One of the more common uses of this technology is in magnetic data storage where data is stored on a magnetic media by varying the magnetic fields of small magnetic particles in the media. The media's magnetic field is made to fluctuate by a write head in proportion with the information to be stored on the media. The fluctuations contained in the media can subsequently be retrieved using a read head.

Standard magnetoresistive sensors, which may be used in read heads to detect the magnetic fields on the magnetic data storage media, use a detection element constructed of a magnetic material subjected to an electrical current. When placed in the presence of an external magnetic field, such as that generated by magnetic storage media, the sensor is able to measure the existence and strength of the external magnetic field through correlation with measurements of the resistivity experienced by the electrical current. The sensor becomes more or less resistive depending upon the magnetic field of the media. This allows, for example, information on magnetic media to be read by measurement of the current flow through the sensor.

Certain magnetoresistive sensors exhibit an increased sensitivity to external magnetic fields. Such sensors experience relatively larger changes in resistivity compared to normal magnetoresistive sensors. These sensors exhibit what is known as the giant magnetoresistive (GMR) effect. Magnetic multilayers, granular solids, and other materials with heterogeneous magnetic nanostructures exhibit GMR effects. Specifically, these structures exhibit a negative GMR effect in which the magnetoresistance decreases with an increase in the magnitude of an external magnetic field. Prototype GMR structures such as multilayers and granular solids require magnetic fields on the order of 10 kOe to fully realize the GMR effect.

The effectiveness of a giant magnetoresistive construction is often measured in terms of its maximum MR effect size denoted by a ratio or percentage figure dependent upon the change in electrical resistance of a material when exposed to an external magnetic field. Currently, most read heads in the magnetic recording industry utilize the anisotropic MR effect in permalloy which has an MR effect of about 2%, or a ratio of 0.02. Recently, most sophisticated read head made of spin-valve GMR structures have been commercialized with an effect size of about 5–10%, or a ratio of 0.05 to 0.10. Maximum MR effect size is dependent upon the resistance of the material at zero magnetic field and the resistance of the material at magnetic saturation. The strength of the saturation magnetic field ($H_s$) is determined by the composition of the material and is the field at which the largest MR effect is realized. The largest MR effect values ever reported have been 150% at low temperatures (e.g., 4 K) and 80% at room temperature at a saturation field of about 20 kOe. Most reported MR values, and particularly those in devices, are much smaller, i.e., in the range of 5% to 10% at room temperature.

Important characteristics for MR devices include the detection limit (i.e., the smallest magnetic field that can be detected), sensitivity (i.e., the percent change of MR per unit magnetic field), and the dynamic range (i.e., the range of magnetic field that can be detected). Not all MR devices value these characteristics in the same way. For example, in read head applications, the detection limit and sensitivity are important, whereas in current sensing applications, the detection limit, sensitivity, and dynamic range are all important. In general, a large MR effect size is always advantageous since it directly improves the detection limit and the sensitivity. In addition, a simple magnetic field dependence (e.g., non-saturable) of the MR and a large dynamic range are desired for field sensors.

Bismuth (Bi) is a semi-metallic element with unusual transport properties, including a large MR and Hall effect. The electronic properties of Bi, which are very different from those of common metals, are due to its highly anisotropic Fermi surface, low carrier concentration, small carrier effective masses, and long carrier mean free path. As a result, bulk single crystals of Bi are known to exhibit a very large MR effect.

Unfortunately, the fabrication of high quality Bi thin films, a necessary requirement for most device applications, is known in the art to be difficult. Deposition of MR thin films generally occurs through one or a combination of the following techniques: chemical vapor deposition (CVD), physical vapor deposition (PVD) (e.g., sputtering, evaporation, etc.), or electrochemical deposition. Bi thin films made by traditional vapor deposition such as sputtering and laser ablation are of very poor quality and exhibit a polycrystalline structure with small grains. As a result, those Bi films exhibit very small MR, on the order of 1–10% at 300 K under a field of 1 Telsa (T), which is unsuitable for applications. Previously, only Bi films made by molecular beam epitaxy, which is a prohibitively expensive method, yielded high quality Bi thin films with large MR.

Electrochemical deposition offers precise control over the microstructure and a process which can be performed economically and reliably. This translates into the possibility for mass production of high quality materials.

However, electrochemical deposition processes used to deposit bismuth directly onto a substrate have thus far been insufficient to produce MR effect levels above 150%. Processes involving the direct electrochemical deposition of bismuth onto substrates or a metallic underlayer have generally resulted in polycrystahine films with voids and other defects. One such process is described in U.S. Pat. No. 5,256,260 (Norton et al.). This process utilizes a constant-current molten salt electrocrystalization bath in which bismuth ions are complexed with a barium-based component and a bismuth-based component. Current electrochemical deposition techniques for bismuth onto a substrate result in polycrystalline films which do not allow for realization of very large MR effects.

SUMMARY OF THE INVENTION

The invention is directed to the use of electrochemical deposition to fabricate thin films of a material (e.g., bismuth)

exhibiting a superior magnetoresistive effect. The process in accordance with a preferred embodiment produces a thin film of bismuth with reduced polycrystallinization and allows for the production of single crystalline thin films. Fabrication of a bismuth thin film in accordance with a preferred embodiment of the invention includes deposition of a bismuth layer onto a substrate using electrochemical deposition under relatively constant current density. Preferably, the resulting product is subsequently exposed to an annealing stage for the formation of a single crystal bismuth thin film. The inclusion of these two stages in the process produces a thin film exhibiting superior MR with a simple field dependence suitable for a variety of field sensing applications.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

The invention will be described in detail with reference to the preferred embodiments illustrated in FIGS. 1–3. The invention is described herein in its preferred application to the formation of bismuth thin films for magnetoresistive sensor devices. However, the invention may be applicable to any type or configuration of layered structure that encounters the same or similar problems overcome by the invention described herein.

Figure 1:
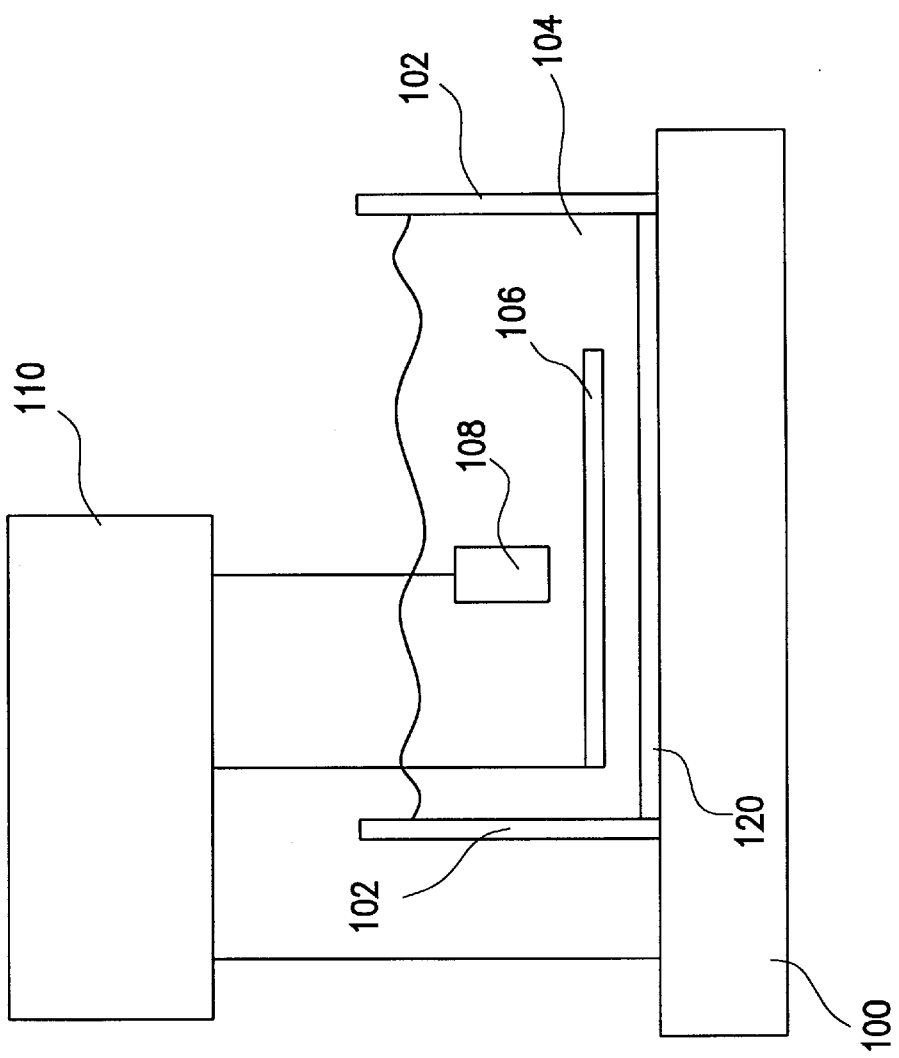
FIG. 1 is a cross-sectional view of the electrochemical cell used to prepare a thin film in accordance with a preferred embodiment of the invention.

FIG. 1 shows an electrochemical deposition cell constructed in accordance with a preferred embodiment of the invention. The novel deposition process occurs through use of the well-known three-electrode process, although it should be understood that a two-electrode or other known electrochemical process may similarly be utilized. In the preferred embodiment, the electrochemical cell is made up of a reference electrode 108, a counter electrode 106, a working electrode (discussed below), and the substrate 100. The electrochemical bath 104 is housed in container 102 allowing the formation of thin film 120 (e.g., bismuth) through the application of a potential by control device 110.

To deposit the exemplary bismuth film directly on the substrate 100, a specific electrochemical or electroplating process is performed in accordance with a preferred embodiment of the invention, preferably using the electrochemical cell shown in FIG. 1. Before a thin film layer made of bismuth can be formed, however, a suitable substrate 100 must be chosen. Any material may be chosen whose surface, which may be flat or otherwise shaped, is stable in the electrochemical deposition bath solution used. The substrate may consist of a single material or may be a layer or a coating of another material.

The choice of substrates will depend upon the end use of the thin film construct. For devices using the MR effect, insulating substrates are preferred over metallic substrates because the large MR effect is not diluted through current shunting, as with the metallic substrate. Some common insulating substrates include silicon (Si) (with or without the native $SiO_2$ layer on the surface), glass, mica, magnesium oxide (MgO), aluminum oxide ($Al_2O_3$), etc. In accordance with a preferred embodiment of the invention, before a bismuth thin film is formed on a substrate made of an insulating material such as silicon, a boundary layer in the form of a thin metallic underlayer is preferably laid over the substrate. The metallic underlayer can be formed by using any known thin film deposition method such as sputtering, evaporation, laser ablation, etc. This metallic underlayer can be any metal (e.g., Au, Pt, Cr, etc.) that is stable in the electrodeposition solution used in this process. FIG. 2 shows an embodiment of the substrate 100 of the invention utilizing a metallic underlayer 118 deposited on an insulating subtrate 200.

Figure 3:
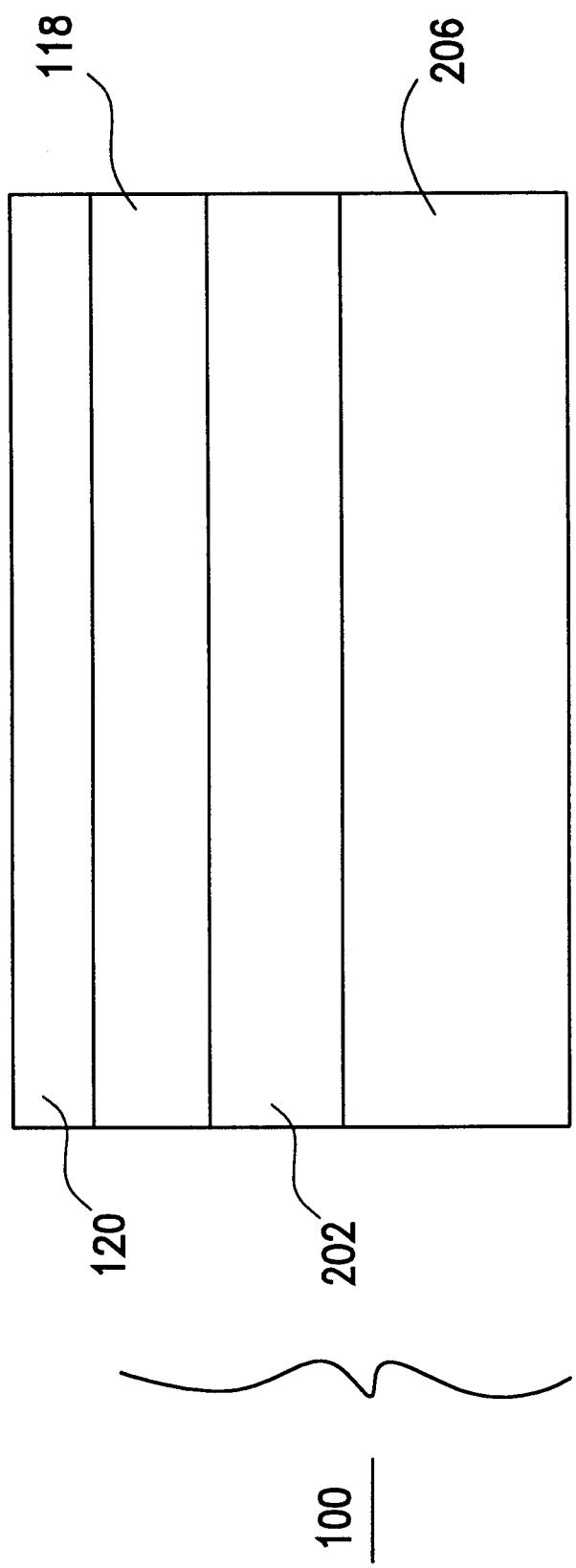
FIG. 3 is a cross-sectional view of another structure produced in accordance with a preferred embodiment of the invention.

If the substrate 100 is metallic, as shown in FIG. 3, it is preferable to first deposit an insulating thin layer 202 on the metallic substrate 206, followed by the metallic underlayer 118. The insulating layer may be any known insulator such as $SiO_2$, glass, MgO, and $Al_2O_3$. This procedure electrically isolates the Bi film and the thin metallic underlayer 118 from the metallic substrate 206, making the electrical measurement on Bi possible. The insulator layer 202 can also protect the metallic substrate 206 from possible reaction with the electrodeposition solution. However, for the electrodeposition of Bi film alone, the creation of insulating layer between the metallic substrate and the bismuth thin film may not be necessary.

Figure 2:
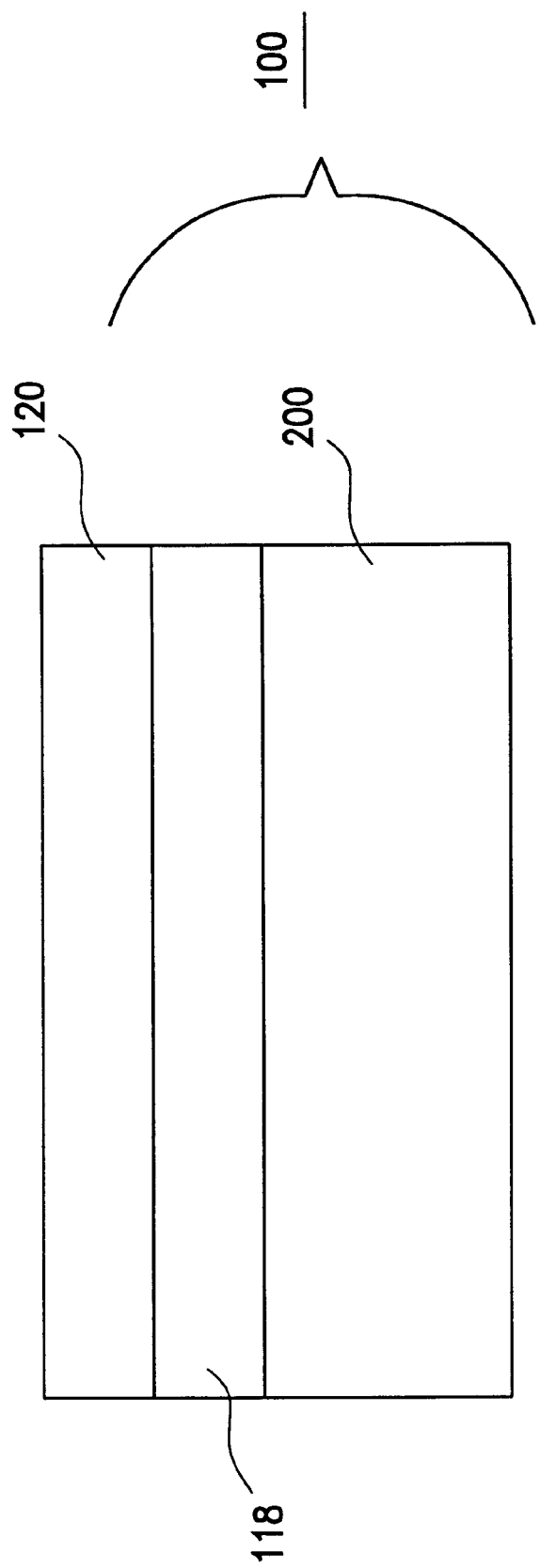
FIG. 2 is a cross-sectional view of the structure produced in accordance with a preferred embodiment of the invention.

Referring to the substrate shown in FIG. 2, a typical substrate (insulating) that may be used is prepared from Au(100 Å)/Cr(10 Å)/$SiO_2$ (native oxide layer on top of Si with a thickness of about 100 Å)/Si (100 orientation), where Au(100 Å)/Cr(10 Å) is the metallic underlayer 118 (Cr is used to provide adhesion of Au to Si), and $SiO_2$/Si is the insulating substrate 200 having a native oxide.

The electrolytic bath 104 used preferably contains bismuth ions in an electrolytic solution. The deposition is preferably performed in the temperature range from 15° C. to 60° C. The solution may be one of several kinds that contain bismuth ions with the appropriate pH. For example, the solution may be prepared from 75 grams/liter $Bi(NO_3)_3.5H_2O$, 65 grams/liter KOH, 125 grams/liter glycerol, 50 grams/liter tartaric acid, and nitric acid ($HNO_3$) to adjust the pH to 0.5. A second example of a solution for bismuth deposition is 75 grams/liter $Bi(NO_3)_3.5H_2O$, 120 grams/liter $KNO_3$, 125 grams/liter glycerol, 50 grams/liter tartaric acid, and nitric acid ($HNO_3$) to lower the pH to 0.5. The pH of the bath is a factor in the formation of single crystalline films in accordance with the invention. For production of single crystal, c-axis (001—indexed in a hexagonal system) Bi films, for example, the electrochemical bath should have a pH value in the range of 0 to 0.6. Another factor in fabricating high quality c-axis oriented single crystalline Bi films is to avoid aging of the solution.

The electrochemical deposition of bismuth in accordance with a preferred embodiment of the invention is performed by placing the substrate as constructed above in the electrolyte solution shown in FIG. 1 as bath 104. As is well known in the art, the bath may resemble the basic three electrode cell structure utilized to perform electrochemical depositions, as shown in FIG. 1. The reference electrode 108 is preferably positioned so that its tip is directly over the region of interest on the planar surface of substrate 100. Reference electrode 108 may be made of any known material (e.g., silver/silver chloride [$Ag^+/AgCl$ (3 M NaCl)]), and may be raised or lowered using a capillary (not shown) or like mechanism. The counter electrode, or current collector 106, is preferably constructed of platinum gauze or mesh. Control device 110 may be a potentiostat-based control system (or like system) provided to control the voltage and current parameters of the electrochemical process in accordance with the invention.

To initiate electrodeposition, an electric potential is applied to the cell by control device 110 across the working electrode and the counter electrode 106, under the constant feedback of the reference electrode 108. The actual contact to the substrate 100 is made to the metallic underlayer 118 which functions as the working electrode and as the surface upon which deposition will occur. The actual potential varies with the surface condition and thickness of the metallic underlayer 118, typically from 90 mV to 140 mV. The current density is preferably kept within the range of 5 $mA/cm^2$ to 8 $mA/cm^2$, preferably 6.5 $mA/cm^2$. The thickness of the Bi films can be controlled through variation of the deposition time. For example, in a bath having a pH value of 0.6, a current density of 6.5 $mA/cm^2$, a charge to volume conversion ratio of $1.36 \times 10^4$ $coulomb/cm^3$, the inventive process required 3.5 minutes to produce a 1 $\mu$m thick Bi film. The $Bi^{3+}$ ions in the solution 104 are typically reduced in accordance with the invention to Bi during electrodeposition with an approximately 100% deposition efficiency (i.e., the percentage of the total charge transfer corresponding to the reduction of $Bi^{3+}$ to Bi).

The Bi films produced in accordance with this process are polycrystalline with large grains. The films exhibit very large MR effects. The MR ratio at room temperature, for example, of the Bi thin films is about 1.5 to 2.5. In contrast, the MR ratio at room temperature for the best Co/Cu multilayers and granular solids is only about 0.8, a factor of 2 to 3 smaller. Moreover, the thickness of the Bi thin films fabricated in accordance with the invention becomes less important. From 1 $\mu$m to 10 $\mu$m, both the MR ratio and the resistivity at room temperature vary relatively little, whereas, at 5 K, the corresponding values vary a great deal. The Bi films formed in accordance with the invention also have a simple magnetic field dependence without saturation or hysteresis. Therefore, the higher the applied external field, the greater the magnetoresistive effect. These Bi thin films can therefore be used as high dynamic-range magnetic field sensors. For many applications using Bi thin films, the Bi films thus constructed require no additional processing.

In accordance with another preferred embodiment of the invention, a novel annealing sequence can be initiated to establish even higher quality Bi thin films through the use of high-temperature processing. At low temperatures, the MR ratios of the annealed Bi thin films are increased by one to two orders of magnitude higher than those of the Bi thin films produced using the deposition processes described above. This unique annealing process for the Bi films may be performed in any inert gas atmosphere, such as an argon (Ar) atmosphere, in a variable temperature environment (e.g., variable temperature oven with a temperature controlling accuracy of ±1° C.). In accordance with the invention, the temperature is increased gradually in ramp fashion, preferably at a rate of approximately 1° C./min from room temperature to 268° C., and held for several hours, depending on the thickness of the Bi film. For films ranging in thickness from 0.5 $\mu$m to 5 $\mu$m, for example, the annealing time should be approximately 4–6 hours. Annealing times for thicker films will increase. For example, a 10 $\mu$m film should be annealed for 10 hours. Afterwards, the temperature is lowered to room temperature at a rate of decline proportional to the rate used to raise the temperature (e.g., in the described example, a rate of decline of approximately 1° C./min would be used). The effect of annealing is that after the annealing process is completed, the films become single-crystalline and thus have a greatly improved MR effect percentage. In the example above utilizing the processes in accordance with preferred embodiments of the invention, the Bi thin films produced resulted in single-crystalline c-axis (001) Bi films. The Bi films exhibit very large MR effect sizes, over 153,000% in some cases. In addition, the resistivity value also decreases significantly because of the high perfection of the single-crystalline material.

The Bi thin films produced by the foregoing novel processes can easily be used as a magnetoresistive sensor for measuring the changes in resistivity in a field. This can be accomplished by running a current through the sensor such that it passes through the bismuth thin film layer 120. In one embodiment, electrical contacts are supplied to bismuth layer 120 such that the contacts are connected to a current source. A non-magnetic conductive layer may be deposited on bismuth layer 120 to facilitate the contact. To sense magnetic fields, a current measuring device such as a potentiometer may be utilized to measure current fluctuations resulting from resistivity changes in the Bi thin film 120. Many such devices are well known in the art and devices utilizing bismuth thin films constructed in accordance with the preferred embodiment of the invention may be implemented in numerous known systems.

In another preferred embodiment, the metallic underlayer may be patterned into any geometrical shape through known masking or deposition processes. This defines the shape of the Bi thin films because the subsequent electrodeposition can occur only on top of the metallic underlayer. More than one underlayer may also be used to promote the growth of material in a certain orientation.

In another preferred embodiment, the single crystalline Bi thin films formed according to the invention can be combined with a magnetic flux concentrator to realize large MR effects at small external magnetic fields. A magnetic flux concentrator consists of soft magnetic materials, which, because of their shape, can channel or concentrate the magnetic flux into a specified region and increase the local magnetic field within this region. When a small external magnetic field is applied, the local magnetic field, after the magnetic flux concentration, can be much larger. If the Bi film is strategically placed at the location where a strong local magnetic field is concentrated, then the Bi film can be made to respond to much smaller external magnetic fields. This would allow the huge MR effect of Bi thin films to be utilized in magnetic recorder read head applications.

While certain embodiments of the invention have been described and illustrated above, the invention is not limited to these specific embodiments as numerous modifications, changes and substitutions of equivalent elements can be made without departing from the spirit and scope of the invention. Accordingly, the scope of the present invention is not to be considered as limited by the specifics of the particular structures which have been described and illustrated, but is only limited by the scope of the appended claims.

What is claimed as new and desired to be protected by Letters Patent of the United States is:

1. A method of fabricating a thin film, the method comprising the steps of:

preparing a substrate for deposition; and electrodepositing material on the substrate under a substantially constant current density so as to fabricate a thin film having a magnetoresistive (MR) ratio of greater than 0.8.

2. The method of fabricating a thin film as recited in claim 1, wherein said electrodepositing step comprises the step of electrodepositing bismuth on the substrate.

3. The method of fabricating a thin film as recited in claim 2, wherein said preparing step comprises the substeps of:

providing an insulating layer; and adding a metallic underlayer over the insulating layer.

4. The method of fabricating a thin film as recited in claim 3, wherein said preparing step comprises the substep of providing the insulating layer on a metallic substrate.

5. The method of fabricating a thin film as recited in claim 2, wherein said electrodepositing step comprises the substep of applying an electric potential to a cell, wherein the cell includes an electrolytic bath containing bismuth ions.

6. The method of fabricating a thin film as recited in claim 5, wherein the electrolytic bath has a pH value of approximately 0.0 to 0.6.

7. The method of fabricating a thin film as recited in claim 5, wherein the electric potential applied in said substep of applying an electric potential is approximately 90 mV to 140 mV.

8. The method of fabricating a thin film as recited in claim 1, wherein said electrodepositing step maintains a substantially constant current density between approximately 5 mA/cm$^2$ to 8 mA/cm$^2$.

9. The method of fabricating a thin film as recited in claim 1, wherein said thin film has an MR ratio of approximately 1.5 to 2.5 at room temperature.

10. The method of claim 1, wherein said electrodepositing fabricates a single crystalline thin film.

11. A method of electrodepositing bismuth to produce a thin film, the method comprising the steps of:

providing an electrolytic bath containing bismuth ions;

applying an electric potential across at least two electrodes;

maintaining a substantially constant current density;

producing a bismuth thin film on a substrate; and annealing the produced bismuth thin film.

12. The method of electrodepositing bismuth as recited in claim 11, wherein said annealing step is performed at a temperature that is increased at a first rate of approximately 1° C./minute from room temperature to approximately 268° C.

13. The method of electrodepositing bismuth as recited in claim 12, wherein said annealing step further comprises the substep of lowering the temperature at a second rate equal to the first rate.

14. The method of electrodepositing bismuth as recited in claim 11, wherein the electrolytic bath has a pH value of approximately 0.5, and the electric potential is maintained at a substantially constant current density of approximately 6.5 mA/cm$^2$ so as to produce a bismuth thin film having an MR ratio between 3.0 to 5.0.

15. The method of electrodepositing bismuth as recited in claim 11, wherein the bismuth thin film after said annealing step is a single crystalline structure.

16. The method of claim 11, wherein said electrodepositing fabricates a single crystalline thin film.

* * * * *